US008456236B2

(12) United States Patent
Moldsvor et al.

(10) Patent No.: US 8,456,236 B2
(45) Date of Patent: *Jun. 4, 2013

(54) MULTIPLE INPUT VARIABLE GAIN AMPLIFIER

(75) Inventors: Oystein Moldsvor, Tiller (NO); Terje Nortvedt Andersen, Trondheim (NO)

(73) Assignee: Hittite Microwave Norway AS, Tiller (NO)

( * ) Notice: Subject to any disclaimer, the term of this patent is extended or adjusted under 35 U.S.C. 154(b) by 71 days.

This patent is subject to a terminal disclaimer.

(21) Appl. No.: 12/747,405

(22) PCT Filed: May 11, 2009

(86) PCT No.: PCT/IB2009/005559
§ 371 (c)(1),
(2), (4) Date: Jun. 10, 2010

(87) PCT Pub. No.: WO2009/141696
PCT Pub. Date: Nov. 26, 2009

(65) Prior Publication Data
US 2010/0277241 A1    Nov. 4, 2010

Related U.S. Application Data

(60) Provisional application No. 61/054,331, filed on May 19, 2008.

(51) Int. Cl.
*H03F 3/45*    (2006.01)
(52) U.S. Cl.
USPC ........................................................ 330/254

(58) Field of Classification Search
USPC .................................... 330/254, 258; 327/359
See application file for complete search history.

(56) References Cited

U.S. PATENT DOCUMENTS

| | | | |
|---|---|---|---|
| 3,916,333 A | 10/1975 | Zuk | |
| 6,278,321 B1 | 8/2001 | Franck | |
| 6,356,152 B1 | 3/2002 | Jezdic et al. | |
| 6,369,658 B1 | 4/2002 | Nilson | |
| 6,566,951 B1 * | 5/2003 | Merrigan et al. | 330/254 |
| 6,583,667 B1 | 6/2003 | Dasgupta et al. | |

(Continued)

FOREIGN PATENT DOCUMENTS

| | | |
|---|---|---|
| EP | 1 686686 A1 | 8/2006 |
| FR | 2 687 865 A1 | 8/1993 |
| FR | 2 756 436 A1 | 5/1998 |
| GB | 2 137 039 A | 9/1984 |

OTHER PUBLICATIONS

Sang-Sao Lee, et al.: "A BiCMOS Continuous-Time Filter for Video Signal Processing Applications" IEEE Journal of Solid-State Circuits, IEEE Service Center, Piscataway, NJ, US, vol. 33, No. 9; Sep. 1, 1998, XP011060805ISSN: 0018-9200; figures 11, 18.

*Primary Examiner* — Steven J Mottola
(74) *Attorney, Agent, or Firm* — Rajesh Vallabh; Foley Hoag LLP

(57) ABSTRACT

A variable gain amplifier (VGA) disclosed herein includes: an input voltage connector; a number of voltage to current converter circuits generating signal currents; a gain adjustment connector adapted to a current steering mechanism; current mirrors connected to each of the voltage to current converters copying the signal currents; and a steering mechanism adapted to steer the copied currents to a load resistor or to another appropriate location based on the signal present at the gain adjustment connector.

21 Claims, 2 Drawing Sheets

U.S. PATENT DOCUMENTS

| | | |
|---|---|---|
| 6,734,736 B2 | 5/2004 | Gharpurey |
| 7,202,738 B1 | 4/2007 | Huijsing et al. |
| 7,688,144 B2 * | 3/2010 | Lee .............................. 330/254 |
| 2003/0122622 A1 | 7/2003 | Gharpurey |
| 2004/0027200 A1 | 2/2004 | Ashby et al. |
| 2004/0174199 A1 | 9/2004 | Simon |
| 2004/0203553 A1 | 10/2004 | Toyota et al. |
| 2007/0096814 A1 | 5/2007 | Chiu |

* cited by examiner

MULTIPLE INPUT VARIABLE GAIN AMPLIFIER

This application is a U.S. National Stage filing under 35 U.S.C. §371 of International Patent Application No. PCT/IB2009/005559 filed on May 11, 2009, which claims priority to U.S. Provisional Application Ser. No. 61/054,331 filed on May 19, 2008.

BACKGROUND

1. Technical Field

Low noise amplification and low noise amplifiers with controllable gain are disclosed.

2. Description of the Related Art

In different types of radar, sonar and ultrasound systems a variable gain amplifier is employed for signal compensation. In all these systems a pulse is emitted from some type of transducer. Echoes from objects are detected by the transducer and the distance to the object is calculated as the pulse speed in the medium times the time from pulse emission to detection. However, as the pulse travels in the medium, the pulse is attenuated. Hence, the echo strength will be lower for echoes arriving a long time after pulse emission compared to echoes arriving early.

A variable gain amplifier (VGA) is used to compensate for this effect. It is controlled such that amplification is increased with time with the same amount as the signal is attenuated. In this way the relative signal power at the output of the VGA can be kept constant.

Previously, the VGA functionality is most commonly implemented with two different approaches. The most common approach is to amplify the signal initially. A variable attenuator is following the first amplification stage resulting in a variable gain function. A better solution can be implemented using current domain techniques. FIG. 1 shows a simplified schematic circuit diagram, 100, of a single ended implementation of the gain adjustment. The input signal to the VGA, 100, in FIG. 1 has form of a current, $I_{IN}$. In practice the gain adjustment circuitry most often will be combined with a voltage to current converter, transconductor, to allow for a voltage input to the VGA.

The operation of the circuitry is as follows. The input current $I_{IN}$ is mirrored by transistors M2 to M6. The size of each transistor is designed relative to M1 by the scaling factors $M=x_n$ such that the current in each of the transistors M2 to M6 are $x_n$ times the current in M1, where $x_n$ is the scaling factor given for a transistor. Output currents from transistor M2 to M6 are summed into a load resistor $R_L$, and the current gain is defined as the current flowing through $R_L$ divided by $I_N$. The current from transistors M2 to M5 are connected through differential pairs, 102, which based on the control voltage $V_{GAIN}$, either steers the current through the load resistor or directly to the supply rail. V1 to V4 are threshold voltages used to determine when each differential pair is switched on. Typically, V1 to V4 would be at different voltages with a few hundred millivolt between each tap. The operation of each differential pair, 102, will depend on whether each differential pair is source degenerated or not. The size of the resistors at the emitter of the differential pairs will determine the voltage range of $V_{GAIN}$ required to turn the differential pair, 102 completely on or off.

Assuming that a given input current is applied to M1 and that $V_{GAIN}$ is set to zero. Also assuming that V1 to V4 are located at increasing voltage potential with V1 at a few hundred millivolt. In this design, all current from M2 through M5 will be steered directly to the supply voltage. The current through M1 will be mirrored by M6 and will be flowing through $R_L$ resulting in a current gain of one (1) assuming ideal transistors with the scaling factor shown in the figure. If a dynamic signal is applied to $I_{IN}$, the signal current will be amplified with unity gain.

If $V_{GAIN}$ is increased, part of the M2 current will start flowing in the load resistor $R_L$, gradually increasing the current gain. As the differential pair above M2 is fully switched on, the increased current gain will be set by the sum of the scaling factors of M6 and M2, which in the case shown in FIG. 1 is two (2). At the time $V_{GAIN}$ reaches V2, part of the M3 current will also be steered through $R_L$ increasing the gain further. Hence, by proper dimensioning of threshold voltages and characteristics of the differential pairs 102, the gain can be smoothly adjusted in a range determined by the current mirror scaling factors. The embodiment in FIG. 1 shows a linear-in-dB gain which means that gain increases exponentially with control voltage. However, alternate characteristics may be achieved by different current mirror scaling.

The implementation in FIG. 2 illustrates a possible differential implementation of a currently available VGA. Transistors M1 to M4 form a traditional prior art differential voltage to current converter. The input voltage is applied between the terminals $V_{INP}$ and $V_{INN}$. Transistors M1 and M2 act as source followers. The input voltage, $V_{IN}=V_{INP}-V_{INN}$ is buffered with a gain close to unity and applied across the input resistor $R_I$. The current through $R_I$, called the signal current $I_S$, will therefore be proportional to the input voltage under ideal conditions, $I_S=V_{IN}/R_I$. As there is only one current branch at each side of the input resistor, the signal current, $I_S$, will also be conducted through the input transistors and transistors M3 and M4. The resulting current through M3 and M4 is therefore a fixed bias current with the signal current $I_S$ on top. The currents through M3 and M4 are mirrored in inverting and non-inverting side circuitry respectively. The differential pairs are either steering the current through the inverting side load resistor or to rail whereby the resulting gain is adjusted. The number of current sources in the mirror can be set arbitrarily depending on required gain control range.

SUMMARY OF THE DISCLOSURE

As an improvement to currently available VGAs, an improved VGA is disclosed which comprises: an input voltage connector; a number of voltage to current converter circuits generating signal currents; a gain adjustment connector adapted to a current steering mechanism; current mirrors connected to each of the voltage to current converters copying the signal currents; and a steering mechanism adapted to steer the copied currents to a load resistor or to another appropriate location based on the signal present at the gain adjustment connector.

In a refinement, a current instead of a voltage can be presented at the output.

Other advantages and features will be apparent from the following detailed description when read in conjunction with the attached drawings.

BRIEF DESCRIPTION OF THE DRAWINGS

For a more complete understanding of the disclosed methods and apparatuses, reference should be made to the embodiment illustrated in greater detail on the accompanying drawings, wherein.

It should be understood that the drawings are not necessarily to scale and that the disclosed embodiments are sometimes illustrated diagrammatically and in partial views. In certain instances, details which are not necessary for an understanding of the disclosed methods and apparatuses or which render other details difficult to perceive may have been omitted. It should be understood, of course, that this disclosure is not limited to the particular embodiments illustrated herein.

DETAILED DESCRIPTION OF THE PRESENTLY PREFERRED EMBODIMENTS

A significant disadvantage of the prior art solutions of the VGA is the requirement to high dynamic range in the input voltage to current converter. At high gains, the input voltage is low, typically in the millivolt range. For low noise operation in this range, the input referred noise voltage of the voltage to current converter must be small. This is obtained by using a small value of $R_I$. At low gains, the input voltage is typically much larger. In this case a high input voltage is applied across a small input resistor. This results in high signal currents, and in addition, the bias currents must be set significantly higher than the signal current for optimum operation of the input transistors M1 and M2. The high signal currents at high input voltages result in a tradeoff between noise, input signal swing and power dissipation, which is a significant limitation of prior art VGA implementations.

The principle of operation disclosed herein is based on a technique for current domain gain adjustment without the problems of high signal currents at high input signal swing.

Figure 1:
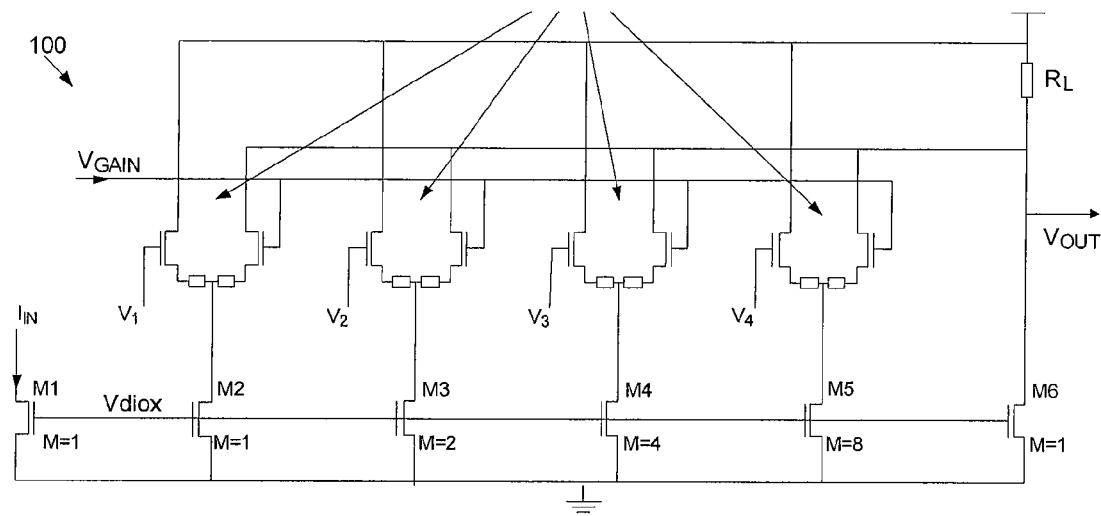
FIG. 1 is a schematic circuit diagram of a typical prior art implementation of a current mode VGA.
Figure 2:
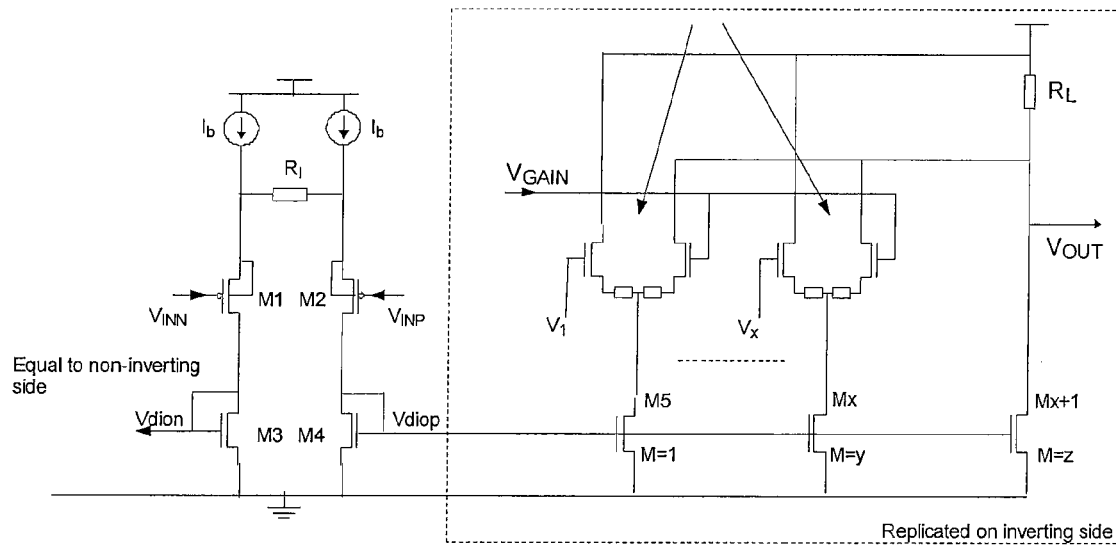
FIG. 2 is a schematic circuit diagram of a complete prior art implementation of a VGA.
Figure 3:
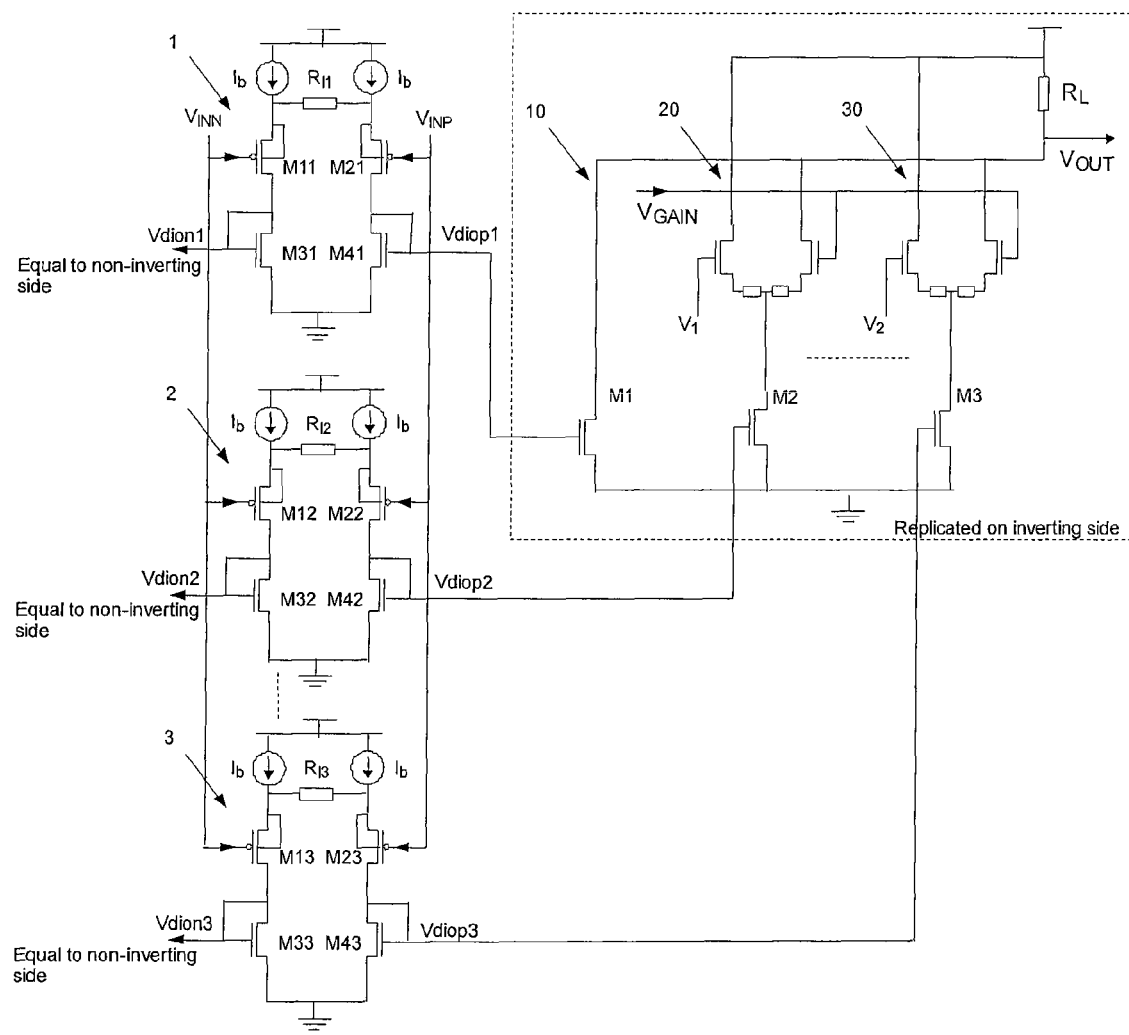
FIG. 3 is a schematic circuit diagram of a preferred embodiment of the invented VGA.

The major improvement disclosed herein is obtained by using multiple voltage to current converters in front of a current domain VGA. FIG. 3 shows an example implementation of one currently preferred embodiment.

The operation of the circuit is as follows. The input signal is applied to a number of voltage to current converters, 1, 2 and 3. The total number of converters can be set arbitrarily such that there could exist zero or several voltage to current converters between 2 and 3. For the rest of the explanation, it is assumed that the total number of stages is three as shown in the FIG. 3. Operation is however equal with increased number of stages. Each of the voltage to current converters are connected to their respective section in the current domain VGA. The current flowing through M41 and M31 is mirrored in transistor M1 and it's replica in inverting side circuitry. The current flowing through M42 and M32 is mirrored in transistor M2 and it's replica in inverting side circuitry. The current flowing through M43 and M33 is mirrored in transistor M3 and it's replica in inverting side circuitry. In the general case the mirror gain between M41 and M1 could be different from the mirror gain between M42 and M2 and M43 and M3. For simplicity of explanation it is assumed that the mirror gain is equal for all mirrors. Also assume that bias currents are equal for all voltage to current converters.

To obtain an efficient variable gain function, the input resistor, $R_I$, must be scaled between the voltage to current converters. For a linear-in-dB gain curve the input resistors should be multiplied by two for each stage. Assume that $R_{I1}=2R$, $R_{I2}=2R$ and $R_{I3}=R$. The result is that the voltage gain is different calculated from the input of each voltage to current converter to the output. The voltage gain from each voltage to current converter separately becomes proportional to $R_L/R_I$. With the resistor values above the gain for voltage to current converter 3 is twice the gain of voltage to current converter 2 and 1.

Assume that a full scale input voltage is applied and that $V_{GAIN}$ is set to zero. Also assume that V1 to V4 are located at increasing voltage potential with V1 at a few hundred millivolt. The current from transistors M2 and M3 will be conducted directly to the supply rail, and the total gain is proportional to $R_L/R_{I1}$. With a full scale input voltage, the output voltage will also be at full scale, and clipping would occur if the voltage was increased. Assume that the input voltage starts decreasing, and that it is desired to keep the output close to full scale. This can be obtained by increasing $V_{GAIN}$. Assume the situation where the differential pair, 20, is conducting all current through the load resistor and the differential pair, 30, is conducting all current to the supply rail. In this situation the total gain from the input to the output will be two times the gain with $V_{GAIN}$ set to zero because the signal current is twice as high. When $V_{GAIN}$ is increased further, the contribution from voltage to current converter 3 will be present in the output. As the input resistor, RI3, is half the size of RI1 and RI2, the gain contribution from voltage to current converter 3 is equal to the sum of 1 and 2. Hence the gain will be multiplied once more by two when voltage to current converter 3 is activated, which is advantageous.

At increasing gain the input voltage has to be reduced in order to prevent saturation of the output stage. With a low input signal swing, the requirement to input referred noise is highest to maintain a nearly constant signal-to-noise ratio over the gain range. However, at max gain, the input stage with the lowest $R_I$ is activated, resulting in low input referred noise.

As the gain is reduced, the swing will increase. However, the voltage to current converters with low $R_I$ will also be disconnected from the output. Hence, it is allowable that the voltage to current converters with low $R_I$ saturate when the input voltage is high. The result is that a high signal voltage never is applied across the input resistors, $R_I$, with low value. In a traditional approach, the bias current, $I_b$, must be dimensioned for a low $R_I$ to obtain low noise, and a high signal swing for the low gain, high swing condition. In disclosed VGA, the bias current can be significantly reduced since the input voltage, and hence the signal current, is limited when the voltage to current converters with low $R_I$ are activated. For high voltage swing the bias currents can be limited since the $R_I$ is high in the voltage to current converters activated in this condition.

The disclosed VGA therefore allows the designer to optimize the $R_I$, bias current and noise for low and high input voltage swings independently. This results in significantly more power efficiency and a low noise design.

Even more design optimization is possible by allowing a different mirror gain between each voltage to current converter and the corresponding differential pair at the output.

In some instances a common mode feedback loop can be advantageous. When using the connection shown in FIG. 3, the current through the load resistor $R_L$ is dependent on the total gain or equivalently the voltage at $V_{GAIN}$. At high gains this becomes a problem as the bias current in the voltage to current converters are summed and saturates the output stage even with no signal at the input. Assuming that the voltage swing at the output should be kept constant, the equivalent input full scale range will be dependent on the total gain. This means that the bias current in the input stage should be reduced when the gain is increased. This would be equivalent to reducing the current, Ib, for each of the voltage to current converters at high gain.

A very efficient implementation of this bias current adjustment is to measure the output common mode voltage (($V_{OUT}$(positive)+$V_{OUT}$(inverting))/2), and control the Ib current, or another appropriate bias current, to keep the output common mode voltage constant.

While only certain embodiments have been set forth, alternatives and modifications will be apparent from the above description to those skilled in the art. These and other alternatives are considered equivalents and within the spirit and scope of this disclosure and the appended claims.

What is claimed:

1. A variable gain amplifier (VGA) comprising:
an input voltage connector;
a plurality of voltage to current converter circuits generating signal currents, each of the voltage to current converter circuits having separately optimized characteristics;
a gain adjustment connector adapted to a current steering mechanism;
current mirrors connected to each of the voltage to current converter circuits copying the signal currents; and
a steering mechanism adapted to steer the copied currents to at least one of a load resistor and another appropriate location based on the signal present at the gain adjustment connector.

2. The VGA of claim 1, further comprising a current output.

3. The VGA of claim 1, further comprising a common mode feedback circuit.

4. The VGA of claim 1, further comprising means to switch off current sources that are conducted directly to a supply or another location where the current does not have any function in the circuitry.

5. The VGA of claim 1, wherein the steering mechanism comprises a plurality of differential pairs, and wherein different threshold reference voltages are provided to each of the differential pairs to enable them to be switched on one by one with increasing gain control voltage.

6. The VGA of claim 1, wherein each of the voltage to current converter circuits has a separately configured bias current.

7. The VGA of claim 1, wherein each of the voltage to current converter circuits has a separately configured input resistor.

8. The VGA of claim 1, wherein each of the voltage to current converter circuits has separately optimized input referred noise.

9. A method of controlling signal amplification in a variable gain amplifier, comprising:
(a) applying an input voltage to a plurality of voltage to current converter circuits, each having separately optimized characteristics;
(b) generating signal currents at the plurality of voltage to current converter circuits from the input voltage;
(c) copying the signal currents generated by the voltage to current converter circuits; and
(d) steering each of the copied signal currents to either a load resistor or a supply rail based on applied threshold reference voltages.

10. The method of claim 9, further comprising summing signal currents flowing through the load resistor to determine current gain.

11. The method of claim 9, wherein step (d) is performed using a plurality of differential pairs, and wherein different threshold reference voltages are provided to each of the differential pairs to enable them to be switched on one by one with increasing gain control voltage.

12. The method of claim 9, wherein step (c) is performed by a plurality of current mirrors.

13. The method of claim 9, wherein each of the voltage to current converter circuits has a separately configured bias current.

14. The method of claim 9, wherein each of the voltage to current converter circuits has a separately configured input resistor.

15. The method of claim 9, wherein each of the voltage to current converter circuits has separately optimized input referred noise.

16. A variable gain amplifier (VGA) comprising:
an input voltage connector:
a plurality of voltage to current converter circuits operatively coupled to the input voltage connector for generating signal currents from the input voltage, each of the voltage to current converter circuits having separately optimized characteristics;
a plurality of current mirrors, each operatively coupled to a different one of the plurality of voltage to current converter circuits for copying the signal currents generated by the voltage to current converter circuit; and
a plurality of differential pairs, each operatively coupled to a different one of the plurality of current mirrors for steering each of the copied signal currents to either a load resistor or a supply rail based on applied threshold reference voltages.

17. The VGA of claim 10, further comprising a common mode feedback circuit.

18. The VGA of claim 16, wherein different threshold reference voltages are provided to each of the differential pairs to enable them to be switched on one by one with increasing gain control voltage.

19. The VGA of claim 16, wherein each of the voltage to current converter circuits has a separately configured bias current.

20. The VGA of claim 16, wherein each of the voltage to current converter circuits has a separately configured input resistor.

21. The VGA of claim 16, wherein each of the voltage to current converter circuits has separately optimized input referred noise.

* * * * *